United States Patent
Tobe et al.

(10) Patent No.: US 6,468,604 B1
(45) Date of Patent: Oct. 22, 2002

(54) METHOD FOR MANUFACTURING A TITANIUM NITRIDE THIN FILM

(75) Inventors: Ryoki Tobe; Hiroshi Doi; Atsushi Sekiguchi, all of Tokyo (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/453,889

(22) Filed: Mar. 3, 2000

(30) Foreign Application Priority Data

Mar. 17, 1999 (JP) .......................................... 11-072640

(51) Int. Cl.[7] .................................................. C23C 8/00
(52) U.S. Cl. ........................ 427/585; 427/237; 427/238; 427/255.394; 427/294
(58) Field of Search ................................. 427/385, 237, 427/238, 255.394, 294

(56) References Cited

U.S. PATENT DOCUMENTS

| | | |
|---|---|---|
| 5,672,385 A | 9/1997 | Jimba et al. |
| 5,741,547 A | 4/1998 | Akram et al. |
| 5,763,007 A | 6/1998 | Weiler |
| 5,770,520 A | 6/1998 | Zhao et al. |
| 5,789,028 A | 8/1998 | Zhao et al. |
| 6,080,446 A | 6/2000 | Tobe et al. |

OTHER PUBLICATIONS

Min, Jae–Sik, et al, "Atomic Layer Deposition of TiN Thin Films by Sequential Introduction of Ti Precursor and NH", Mat. Res. Soc. Symp. Proc., vol. 514, 1998, pp. 337–342 (No month avail.).

Intemann, A., et al, "Applications and Properties of MOCVD Titanium Nitride", Advanced Metallization for ULSI Applications in 1994, Oct. 4–6, 1994, pp. 209–229.

Musher, Joshua N, et al, Atmospheric Pressure Chemical Vapor Deposition of Titanium Nitride from Tetrakis (Diethylamido) Titanium and Ammonia, J. Electrochem. Soc., vol. 143, No. 2, Feb. 1996, pp. 736–744.

Nakamura, Koichi, et al, "Quantum Chemical Study of Model Reactions for CVD of Titanium Nitride from Alkylamido Titanium and Ammonia", pp. 43, 44, 1998. (No month avail.).

Paranjpe, Ajit, et al, "Chemical Vapor Deposition of TiN Process for Contact/Via Barrier Applications", J. Vac. Sci. Technol. B 13(5), Sep./Oct. 1995, pp. 2105–2114.

Kim, So Won, et al, "Low Pressure MOCVD of TiN Thin Films", Applied Surface Science 100/101 (1996), pp. 546–550 (No month avail.).

Raaijmakers, Ivo J., "Low Temperature Metal—Organic Chemical Vapor Deposition of Advanced Barrier Layers for the Microelectrics Industry", This Solid Films, 247 (1994), pp. 85–93 (No month avail.).

Sekiguchi, A. et al., Low Temperature and Low Pressure Process Metalorganic Chemical Vapor Deposition (MOCVD) . . . ; Materials Research Society 1996 conference proceedings, pp. 355–361. (No month avail.).

Robert L. Jackson et al.; MOCV D of Titanium Nitride from TDEAT and $NH_3$; pp. 224–229; Conference proceedings ULSI–X; 1995 Materials Research Society (No month avail.).

Tobe, Ryoki, et al, "Effects of $NH_3$ Addition on Improving Step Coverage and MOCVD–TiN Films Using TDEAT", (English–language Abstract), pp. 77–82, Jun. 17–18, 1999.

*Primary Examiner*—Bernard Pianalto
(74) *Attorney, Agent, or Firm*—Burns, Doane, Swecker & Mathis, LLP

(57) ABSTRACT

A method of manufacturing a titanium nitride thin film at the surface of a substrate the chemical vapor deposition method (CVD method) includes supplying trakisdialkylamino titanium (TDAAT and ammonia into a reaction vessel, and heating it a prescribed temperature under a low pressure of less than 100 Pa total pressure, wherein the partial pressure $P_{TDAAT}$ of the source-material gas is set in a range of $0<P_{NH_3}/P_{TDAAT}<10$ with respect to the partial pressure $P_{NH_3}$ of the added ammonia gas.

20 Claims, 5 Drawing Sheets

TDAAT

R = Alkyl group

METHOD FOR MANUFACTURING A TITANIUM NITRIDE THIN FILM

CROSS-REFERENCE TO RELATED APPLICATIONS

Referenced-applications

The present application claims the priority of Japanese Patent Application No. 11-72640, filed on Mar. 17, 1999, the entire contents of which are hereby incorporated herein by reference.

STATEMENT REGARDING FEDERALLY SPONSORED RESEARCH

Not Applicable

REFERENCE TO A MICROFICHE APPENDIX

Not Applicable

BACKGROUND OF THE INVENTION

1. Description of Related Art

Conventionally, the chief method employed for growing titanium nitride thin film on a substrate such as for a semiconductor device, electronic components of various types, or sensors of various types was reactive sputtering, using a metallic titanium target and nitrogen gas. In recent years, with ultra-miniaturization of large-scale silicon integrated circuits, the design rule of DRAMs of 64 megabits or more has become less than 0.35 $\mu$m, approximately, and, furthermore, the aspect ratio of device contact holes is increasing. When titanium nitride thin film is employed as the barrier metal of such contact holes, if the titanium nitride thin film is deposited by the conventional reactive sputtering method, there is the problem that step coverage is poor. In particular, conformal deposition on the side walls cannot be achieved. If the step coverage is poor, the electrical characteristics of the semiconductor device are adversely affected. It is anticipated that this may present serious problems in manufacture of next-generation devices. Deposition of a conformal barrier metal using the CVD method, having excellent contact hole filling characteristics and coverage characteristics is therefore desired.

Against this background, techniques for manufacturing titanium nitride thin films by the CVD method (chemical vapor-phase deposition method) have therefore attracted attention in recent years. Various CVD methods and/or source-material gases for manufacture of titanium nitride thin films are currently being proposed, and one of these is a technique using tetrakisdialkylamino titanium (herein below abbreviated to TDAAT), which is an organo-metallic compound. The chemical structural formula of this TDAAT is shown in FIG. 5. In this chemical structural formula, R is an alkyl group. When this R is an ethyl group, the compound is tetrakisdiethylamino titanium (abbreviated hereinbelow to TDEAT).

These organo-titanium compounds are liquid at room temperature and atmospheric pressure, but are supplied in vaporized form into the reaction vessel through a shower head together with carrier gas such as $H_2$, Ar, or $N_2$. An added gas (ammonia gas) that reacts chemically with the organo-titanium compound is also supplied into the reaction vessel. A substrate is present in the reaction vessel, this substrate being maintained at a prescribed reaction temperature.

The organo-titanium compound and added gas generate a reaction that produces titanium nitride, with the result that a film of titanium nitride (TiN) is deposited on the substrate.

It is known that the electrical properties and step coverage of the titanium nitride that is deposited depend on the flow rate of the organo-titanium compound and added gas that react within the reaction vessel and on the substrate temperature and reaction pressure.

For example, in Ivo J. Raajimakers, "Low temperature MOCVD of advanced barrier layers", Thin solid films, 247 (1994) 85–93, or reference literature cited therein, titanium nitride thin film is manufactured by supplying source material TDAAT together with a carrier gas into a reaction vessel, further employing ammonia gas ($NH_3$) as added gas. The flow rate of the ammonia gas is 1000 sccm, or more. When the titanium nitride thin film that was obtained was deposited on contact holes of diameter 0.8 $\mu$m and an aspect ratio of 1, good step coverage of 85% was obtained. However, in the case of the contact holes of diameter of 0.35 $\mu$m or less that are employed in 64 megabit DRAMs, it is anticipated that the step coverage would be less than 20%.

Also, Jackson et al "R. L. Jackson, E. J. M Cineney, B. Roberts, J. Strupp, A. Velaga, S. Patel, and L. Halliday, Proc. Advanced Metallization for ULSI Application, ed. by D. P. Favreau, Y. Shacham-Diamond, and Y. Horiike (Mat. Res. Soc., Pittsburgh, Pa., 1994), p. 20" vaporized TDEAT source material by passing it through a vaporizer, and supplied this to a reaction vessel through a shower head together with nitrogen gas as a carrier gas. Titanium nitride thin film was manufactured by further adding ammonia gas ($NH_3$) by passing this through a shower head on a separate path. This reference reports in particular the effect of the ratio of the amounts of source material and ammonia gas supplied. In the case of contact holes of diameter 0.35 $\mu$m and an aspect ratio of 3.4, under the conditions: deposition temperature 350° C., pressure 10 to 50 Torr, the step coverage decreased from 65% to about 20% with an increase in the amount of ammonia gas added. Further, when the deposition temperature was raised to 425° C., for the same contact holes, the step coverage fell to 5%. Thus, in the case of TDEAT, when the flow rate of ammonia gas was increased, insufficient step coverage of fine contact holes was obtained.

Accordingly, the inventors proposed, in Japanese patent application number 10-241138, filed on Aug. 13, 1998, a method of manufacturing a thin film and a thin-film manufacturing device that makes possible the deposition of an excellent TiN film of step coverage of better than 70% of contact holes of an aspect ratio of 4, by specifying the respective flow rates and flow speeds of TDAAT and its carrier gas ($N_2$) and the added ammonia gas and its carrier gas ($N_2$). However, at the stage of the previous application, excellent film deposition with step coverage better than 70% in respect of holes of aperture diameter of 0.25 $\mu$m or less and an aspect ratio of 6 or more was difficult.

In the prior art of Jackson et al, referred to above, it was established that step coverage of contact holes was adversely affected when ammonia gas was added to TDAAT. This presented a considerable problem in the adoption of the technique of deposition of titanium nitride by the CVD method using an organic titanium compound in the mass-production of semiconductor devices.

However, while it was established by the previous application of the present inventors, mentioned above, that excellent step coverage of holes having an aspect ratio of 4 could be obtained by trace addition of ammonia gas, the problem remained that this was difficult in practice in respect of holes of an aspect ratio of 6 or more.

2. Field of the Invention

This invention relates to a method and device for manufacturing titanium nitride thin film by supplying TDAAT gas and ammonia gas into a reaction vessel, the gas pressure and temperature being controlled with the object of obtaining excellent step coverage in regard to holes of aspect ratio 6 or more, using the CVD method.

BRIEF SUMMARY OF THE INVENTION

This invention relates to a method of manufacturing titanium nitride thin film and a manufacturing device therefor, using TDAAT as source material, by optimizing the rate of supply (partial pressure) of added ammonia gas when titanium nitride thin film is manufactured by the CVD method, with an object of obtaining excellent step coverage of contact holes or grooves having an aperture diameter of under 0.25 μm and an aspect ratio of more than 6.

A method of manufacturing a titanium nitride thin film according to this invention includes the deposition of a titanium nitride thin film onto a substrate by the CVD method using tetrakisdialkylamino titanium (TDAAT) and ammonia gas that reacts therewith, whose chief characteristic is that the range of optimum rate of supply of added ammonia gas (partial pressure) is established in terms of the partial pressure relationship between the two materials: source-material gas (TDAAT) and added ammonia gas.

Specifically, a method according to this invention includes a method of manufacturing a titanium nitride thin film at the surface of a substrate by the chemical vapor deposition method (CVD method) by supplying tetrakisdialkylamino titanium (TDAAT) and ammonia into a reaction vessel, and heating it to a prescribed temperature under a low pressure of less than 100 Pa total pressure, wherein the partial pressure $P_{TDAAT}$ of the source-material gas (TDAAT) is set in a range of $0<P_{NH_3}/P_{TDAAT}<10$ with respect to the partial pressure $P_{NH_3}$ of the added ammonia gas, and wherein the tetrakisdialkylamino titanium (TDAAT) is tetrakisdiethylamino titanium (TDEAT).

Also, this invention relates to a device for manufacturing titanium nitride thin film, the device including a reaction vessel capable of vacuum pumping; a vacuum pumping device capable of maintaining the interior of the reaction vessel at low pressure of less than a total pressure of 100 Pa by evacuating the interior of this reaction vessel; a gas supply device for introducing source-material gas into the reaction vessel; a substrate holder that holds a substrate onto which the titanium nitride thin film is deposited; and a heating device that heats the substrate; characterized in that it comprises a mass flow controller and pressure controller such as to make the partial pressure $P_{TDAAT}$ of the source-material gas (TDAAT) satisfy the relationship $0<P_{NH_3}/P_{TDAAT}<10$ with respect to the partial pressure $P_{NH_3}$ of an added ammonia gas.

In general, the film growth species (precursor of formation of TiN film) of TDAAT source-material gas used on its own has a high probability of sticking and low diffusion speed with respect to the substrate surface.

Specifically, it may be predicted that within contact holes, as the aspect ratio (contact hole depth H/hole diameter D) becomes larger, most of the TDAAT film growth species, due to the properties of the TDAAT film growth species, will be immediately deposited on the inside wall in the vicinity of the concavity of the contact hole, resulting in little of the film growth species being able to diffuse in the depth direction, so producing poor step coverage.

However, due to the addition of ammonia gas, which is of a high diffusion coefficient, to the source-material TDAAT gas, the ammonia gas displays high reactivity with the TDAAT. The ammonia gas easily diffuses in the depth direction within the contact holes. As a result, a supply of film growth species thereto is increased, resulting in the benefit that TiN film is formed uniformly on the side walls in the depth direction or at the bottom.

Furthermore, regarding the amount of this added ammonia, as mentioned above, it is desirable that a trace supplied amount should be set such that $0<P_{NH_3}/P_{TDAAT}<10$, where $P_{TDAAT}$ is the partial pressure of the source-material gas and $P_{NH_3}$ is the partial pressure of the ammonia gas.

In order to clarify the reasons for the control of the supplied amount, the relationship between coverage and the ratio $(P_{NH_3}/P_{TDAAT})$ of the partial pressure of the ammonia with respect to the partial pressure of the TDAAT was investigated.

The substrate temperature was set within the range of 300° C. to 350° C., which is believed to constitute a practically useful typical temperature range.

From FIG. 3, it can be seen that, as the partial pressure of the ammonia increases with respect to the partial pressure of TDAAT, there exist a region (A) in which coverage changes abruptly, and a region (B) in which coverage is fixed without displaying any change. Also, the point (this will be called PCN) at which the coverage starts to cease to display change with respect to $P_{NH_3}/P_{TDAAT}$ shows a lower value in terms of $P_{NH_3}/P_{TDAAT}$ value at 350° C. than it does at 300° C. It may be predicted that PCN shifts to low values of $P_{NH_3}/P_{TDAAT}$ as the substrate temperature becomes higher than 300° C.

From the above, it was established that, regarding the optimum amount of ammonia to be added, a prescribed amount of $0<P_{NH_3}/P_{TDAAT}<10$ in relation to the partial pressure of the source-material TDAAT is desirable. The device construction and process conditions used in reaching the results of FIG. 3 are described in detail in the preferred embodiments described herein.

The flow rates of the TDAAT and ammonia gas can be adjusted by respective mass flow controllers. The TDAAT and ammonia gas flow rates relative to the respective carrier gas $N_2$ can also be adjusted by dedicated mass flow controllers.

TDEAT may be employed as the TDAAT. The carrier gas does not contribute to the chemical reaction with TDAAT, and it is appropriate to employ nitrogen gas in both cases.

DETAILED DESCRIPTION OF THE INVENTION

The present invention includes a method of manufacturing a titanium nitride thin film at the surface of a substrate by the chemical vapor deposition method (CVD method) by supplying tetrakisdialkylamino titanium, an added gas that reacts therewith, and ammonia into a reaction vessel, and heating it to a prescribed temperature under low pressure of less than 100 Pa total pressure, wherein the partial pressure $P_{TDAAT}$ of the source-material gas is set in a range of $0<P_{NH_3}/P_{TDAAT}<10$ with respect to the partial pressure $P_{NH_3}$ of the ammonia gas. In this invention, the tetrakisdialkylamino titanium (TDAAT) is tetrakisdiethylamino titanium (TDEAT).

A further aspect of the present invention relates to a device for manufacturing titanium nitride thin film. The device includes a reaction vessel capable of vacuum pumping; a vacuum pumping device capable of maintaining the interior of the reaction vessel at a low pressure of less than a total pressure of 100 Pa by vacuum-pumping the interior of the reaction vessel; a gas supply device for introducing source-material gas into the reaction vessel; a substrate holder that holds a substrate onto which the titanium nitride thin film is deposited; a heating device that heats the substrate; a mass flow controller and pressure controller such as to make the partial pressure $P_{TDAAT}$ of the source-material gas (TDAAT) satisfy the relationship $0<P_{NH_3}/P_{TDAAT}<10$ with respect to the partial pressure $P_{NH_3}$ of the added ammonia gas.

Furthermore, the relationship of the partial pressure $P_{TDAAT}$ of the source-material gas (TDAAT) with respect to the partial pressure $P_{NH_3}$ of the added ammonia gas may satisfy the relationship $0.6<P_{NH_3}/P_{TDAAT}<8$. Within this range, step coverage for a hole with a diameter of 0.25 micrometers and an aspect ratio of 6 is about 100% at a substrate temperature of 300° C.

When the relationship of the partial pressure $P_{TDAAT}$ of the source-material gas (TDAAT) with respect to the partial pressure $P_{NH_3}$ of the added ammonia gas is within the range of $0.6<P_{NH_3}/P_{TDAAT}<3$, the resistivity of a TiN film deposited at 350° C. is about 10 milliohm-centimeter at a film thickness of 10 nanometers. This is about one-fifth the resistivity of a film deposited at 300° C., if all of the other conditions are the same.

EXAMPLE 1

Figure 1:
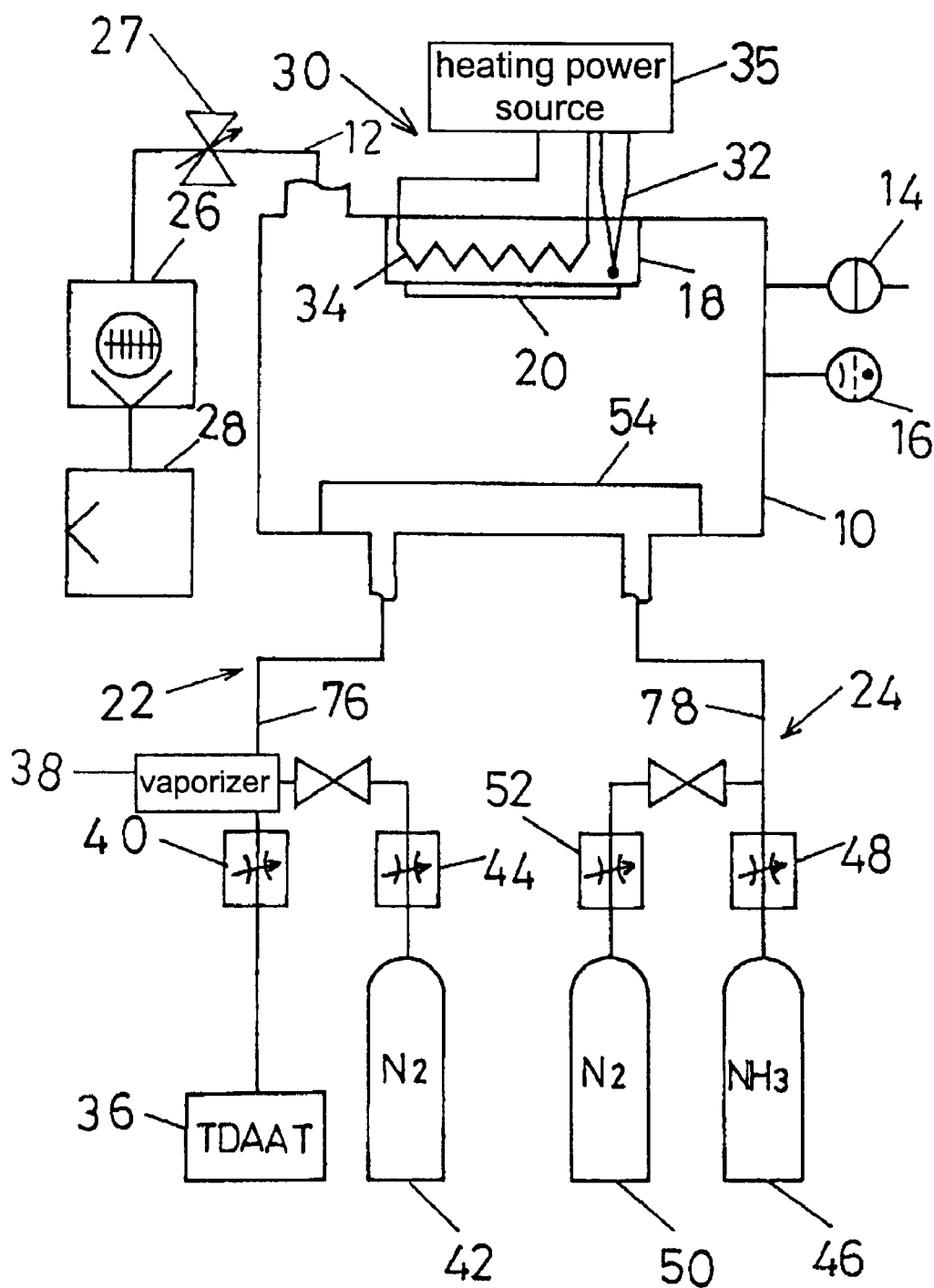
FIG. 1 is a plan diagram of an example of a CVD device for putting into practice a method of manufacturing titanium nitride thin film according to this invention.

FIG. 1 is a constructional diagram of an example of a CVD device for putting into practice a method of manufacturing a titanium nitride thin film according to the present invention. In the interior of a reaction vessel 10, which is provided in this device, there is a substrate holder 18, and a substrate 20 is mounted on the substrate holder 18. Titanium nitride thin film is manufactured at the surface of the substrate 20. There is a shower head 54 for gas introduction facing the substrate holder 18. A source-material gas can be introduced through the shower head 54 from a source-material gas introduction system 22, and added gas can be introduced from an added gas introduction system 24.

The reaction vessel 10 is preferably made of stainless steel and can be vacuum-pumped by a vacuum pumping system 12, and its interior can be maintained gas-tight. The vacuum pumping system 12 comprises a turbo molecular pump 26, a dry pump 28, and a pressure control valve 27. The interior of the reaction vessel 10 can be pumped down to a pressure of $10^{-4}$ Pa by the evacuation system 12, and can be maintained at a desired pressure. The dry pump 28 is preferably a dry pump V060F dry pump manufactured by Anelva Inc., its pumping speed being 1000 liter/min.

As vacuum gages to measure the pressure within the reaction vessel 10, there are provided a first vacuum gage 14 for low-vacuum use and a second vacuum gage 16 for high-vacuum use. The first vacuum gage 14 is a high-precision diaphragm vacuum gage having a pressure measurement range of 0.1 Pa to 133 Pa. In this embodiment, a Baratron TYPE 128A gage manufactured by MKS Inc. is employed. The second vacuum gage 16 is an ionization vacuum gage having a pressure measurement range of $10^{-2}$ Pa to $10^{-6}$ Pa. In this embodiment, a BA gage UGD-1S manufactured by Anelva Inc. is employed.

The substrate holder 18 is provided with a substrate heating device 30 for heating the substrate 20. The substrate heating device 30 comprises a thermocouple 32 for measuring the temperature of the substrate 20, a heater 34, and a heating power source 35. The heating power source 35 performs PID control (or PI control, ON-OFF control, fuzzy control or another control system) of the substrate temperature in accordance with the measured value of the temperature.

The source-material gas introduction system 22 comprises a source-material vessel 36 that accommodates the TDAAT constituting the liquid source material; a vaporizer 38 that vaporizes the liquid TDAAT; a first mass flow controller 40 controlling the flow rate of vaporized TDAAT gas; a gas cylinder 42 for accommodating the carrier gas for the TDAAT gas; and a mass flow controller 44 for controlling the flow rate of the carrier gas. The vaporizer 38 is a VU-104 manufactured by LINTEC Co., Ltd. Inc. that does not perform bubbling. The vaporized TDAAT is mixed with the carrier gas and is supplied through a supply path 76 to the shower head 54.

The added gas introduction system 24 comprises an added gas cylinder 46 which accommodates the added gas (ammonia gas), a mass flow controller 48 which controls the flow rate of the added gas, a gas cylinder 50 accommodating the carrier gas for the added gas, and a fourth mass flow rate controller 52, which controls the flow rate of the carrier gas. The added gas is mixed with the carrier gas and is supplied to the shower head 54 through the supply path 78.

To give typical examples of the various types of gases, the source material gas may be a titanium organometallic precursor, such as TDEAT, while the added gas is ammonia gas, and the respective carrier gases are nitrogen gas. In the description given below, unless otherwise stated, these typical gases are employed.

Figure 2:
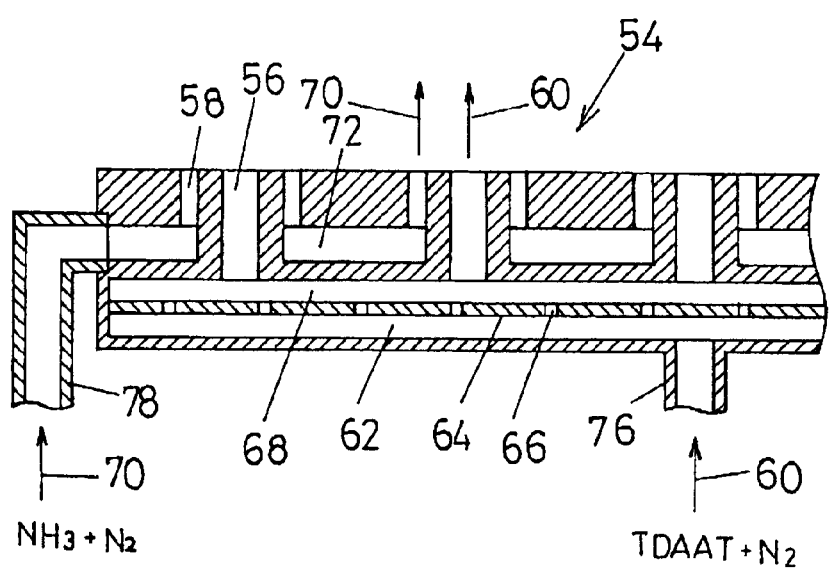
FIG. 2 is a plan view of a shower head.

In FIG. 2, mixed gas 60 consisting of source material gas and carrier gas ($N_2$) first of all enters a first diffusion chamber 62 of the shower head 54 through the first supply path 76. Next, it enters a second diffusion chamber 68 through diffusion apertures 66 formed in a diffusion plate 64. Then, after being uniformly mixed in these diffusion chambers 62, 68, it is issued into the interior of the reaction vessel through first injection apertures 56. The mixed gas 70, consisting of ammonia gas and carrier gas ($N_2$ passes through a second supply path 78 and first of all enters a third diffusion chamber 72 of the shower head 54 and is then issued to the interior of the reaction vessel through second injection apertures 58.

In order to maintain the desired partial pressures of the TDAAT and the ammonia gas, the carrier gas $N_2$ may be within the range of 100 to 300 sccm.

EXAMPLE 2

In order to implement a method of manufacturing a TiN thin film according to the present invention, film deposition was performed using the CVD device described above, in accordance with the. following process conditions, and coverage evaluation determination was performed.

(1) Source material gas: TDAAT (TDEAT)

(2) Added gas: ammonia (3) Carrier gas: $N_2$ for both the TDEAT and ammonia (4) Purge gas: Ar . . . 50 cc (in order to prevent film deposition on to the back of the substrate, not shown)

(5) Substrate temperature: 300° C., 350° C.

(6) Pressure (total pressure): 1 to 20 Pa (7) Substrate hole diameter (aspect ratio): 0.25 μm (6 to 8).

The partial pressure ($P_{TDAAT}$) of the TDAAT and the partial pressure of the ammonia gas ($P_{NH_3}$) are obtained by varying the flow rate of both carrier gases, or the total pressure.

Figure 4:
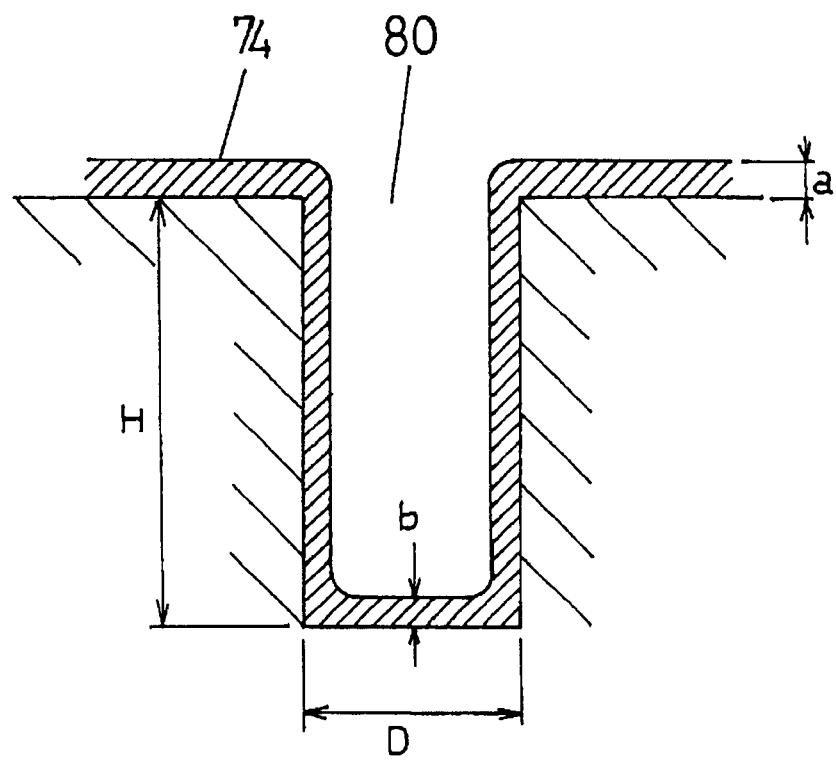
FIG. 4 is a cross-sectional view of a condition in which titanium nitride thin film is deposited on a contact hole.
Figure 5:
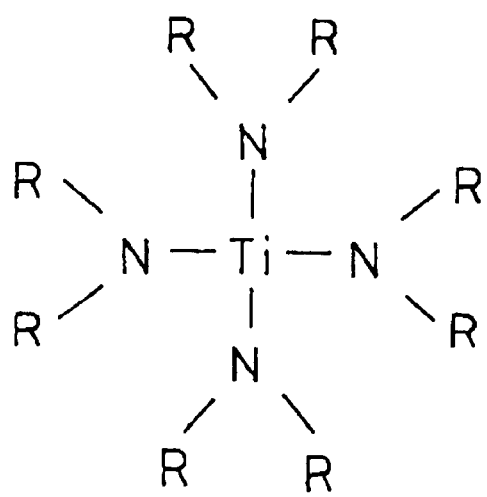
FIG. 5 is a view showing the chemical structural formula of TDAAT.

FIG. 4 is a cross-sectional view of the condition when a titanium nitride thin film is deposited on a contact hole 80. The aspect ratio of the contact hole 80 is defined by "depth H"÷"hole diameter D". Also, the step coverage of the contact hole 80 is defined as the ratio of the deposition thickness "b" at the bottom face of the contact hole with respect to the deposition thickness "a" outside of the contact hole of the titanium nitride thin film 74. The step coverage (%)=(b/a)×100. The step coverage was measured by SEM observation.

Figure 3:
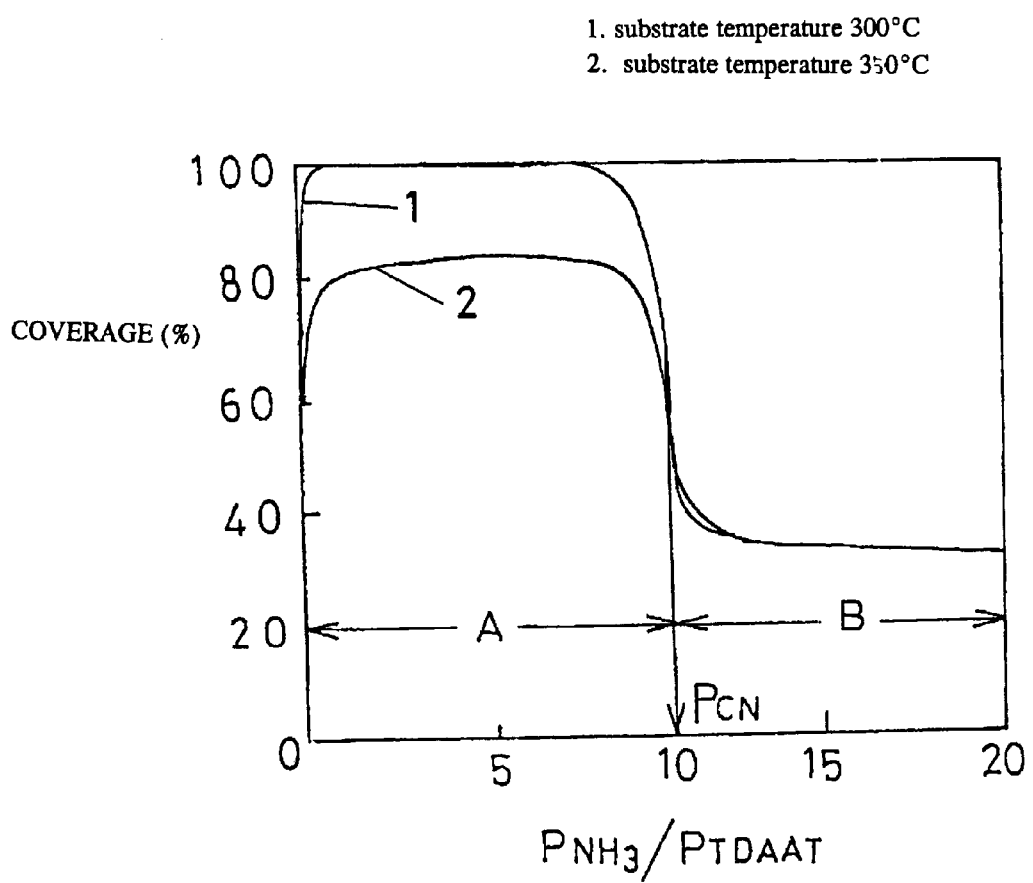
FIG. 3 is a diagram of the relationship between coverage of TiN film and the ratio of partial pressure of $NH_3$ to partial pressure of TDAAT $(P_{NH_3}/P_{TDAAT})$.

FIG. 3 shows the relationship of the ratio ($P_{NH_3}/P_{TDAAT}$) of the partial pressure of ammonia with respect to the partial pressure of TDAAT, and the coverage of contact holes of hole diameter of 0.25 μm, and an aspect ratio of 6.

The substrate temperature was set within the range of 300° C. or 350° C., which is believed to constitute a practically useful typical temperature range.

From FIG. 3, it can be seen that, as the partial pressure of the ammonia increases with respect to the partial pressure of TDAAT, there exist a region (A) in which coverage changes abruptly, and a region (B) in which coverage is fixed without displaying any significant change.

Excellent values of the coverage were displayed, being about 70% to 100% when the substrate temperature was 300° C., and about 70% to 80% when the substrate temperature was 350° C. in region A.

Even in the region of a substrate temperature up to 400° C., excellent step coverage values of more than 70%, which is considered to pose no practical problems, were found to be obtained.

If the substrate temperature is significantly below 280° C., the deposition rate becomes extremely slow, which is not practical for mass production.

Also, in the region of total pressure up to 100 Pa during deposition, the same trend was displayed; even when TDMAT (tetrakisdimethylamino titanium) was employed as the source material gas, it was found that the same benefits were obtained. Furthermore, tetrakis(ethylmethylamino) titanium (TEMAT) can be used as the source gas.

With this invention, by means of a thin-film manufacturing method and a thin-film manufacturing device wherein titanium nitride thin film (TiN film) is deposited onto the surface of a substrate heated to a prescribed temperature and under low pressure of less than total pressure 100 Pa using the CVD method (chemical vapor deposition method) by supplying into a reaction vessel tetrakisdialkylamino titanium (TDAAT), an added gas that reacts with this, and ammonia, the partial pressure $P_{NH_3}$ and partial pressure $P_{TDAAT}$ satisfying the relationship $0<P_{NH_3}/P_{TDAAT}<10$, the benefit is presented of obtaining excellent step coverage for holes of aspect ratio 6 or more.

Although only preferred embodiments are specifically illustrated and described herein, it will be appreciated that many modifications and variations of the present invention are possible in light of the above teachings and within the purview of the appended claims without departing from the spirit and intended scope of the invention.

DEPOSIT OF COMPUTER PROGRAM LISTINGS

Not Applicable

What is claimed is:

1. A method of manufacturing a titanium nitride thin film at the surface of a substrate by chemical vapor deposition, comprising the steps of:

supplying an organometallic precursor and an added gas that reacts with the organometallic precursor into a reaction vessel; and heating the supplied gases to a prescribed temperature under low pressure of less than 100 Pa total pressure, wherein the ratio of the partial pressure of the added gas over the partial pressure of the organometallic precursor is in a range of 0 to 10;

wherein the thin film is formed in holes having an aspect ratio of 6 or higher.

2. The method of claim 1, wherein the organometallic precursor is tetrakisdialkylamino titanium (TDAAT).

3. The method of claim 2, wherein the tetrakisdialkylamino titanium (TDAAT) is tetrakisdiethylamino titanium (TDEAT).

4. The method of claim 2, wherein the added gas is ammonia.

5. The method of claim 4, wherein a carrier gas is added to the added gas.

6. The method of claim 5, wherein the carrier gas is $N_2$.

7. The method of claim 2, wherein the tetrakisdialkylamino titanium (TDAAT) is tetrakisdimethylamino titanium (TDMAT).

8. The method of claim 2, wherein the tetrakisdialkylamino titanium (TDAAT) is tetrakis(ethylmethylamino) titanium (TEMAT).

9. The method of claim 2, wherein a carrier gas is added to the added gas.

10. The method of claim 9, wherein the carrier gas is $N_2$.

11. The method of claim 1, wherein the added gas is ammonia.

12. The method of claim 1, wherein the ratio is within the range of 6 to 8.

13. The method of claim 1, wherein the prescribed temperature is within the range of 280° C. to 400°.

14. The method of claim 1, wherein the prescribed temperature is about 300° C.

15. The method of claim 1, wherein the prescribed temperature is about 350° C.

16. The method of claim 1, further comprising the step of adding a carrier gas at a rate of 100 to 300 sccm.

17. The method of claim 1, wherein a carrier gas is added to the added gas.

18. The method of claim 17, wherein the carrier gas is $N_2$.

19. The method of claim 1, wherein the thin film is formed in the holes with a coverage of at least 70%, wherein the coverage in a hole is defined as a ratio of a thickness of the thin film at a bottom face of the hole with respect to a thickness of the thin film outside the hole.

20. The method of claim 1, wherein the thin film is formed in the holes with a coverage of at least 80%, wherein the coverage in a hole is defined as a ratio of a thickness of the thin film at a bottom face of the hole with respect to a thickness of the thin film outside the hole.

* * * * *